United States Patent [19]

Ishihara et al.

[11] Patent Number: 4,638,109
[45] Date of Patent: Jan. 20, 1987

[54] SUN LIGHT ELECTRICITY GENERATOR

[75] Inventors: Takashi Ishihara, Ashiya; Kazuhiro Okaniwa, Itami; Genshiro Nakamura, Amagasaki, all of Japan

[73] Assignee: Mitsubishi Denki Kabushiki Kaisha, Tokyo, Japan

[21] Appl. No.: 731,276

[22] Filed: May 7, 1985

[30] Foreign Application Priority Data

May 15, 1984 [JP] Japan .................................. 59-97848

[51] Int. Cl.⁴ ...................... H01L 31/06; H01L 27/14
[52] U.S. Cl. .................................... 136/244; 136/249; 136/258
[58] Field of Search ........... 136/244, 249 TJ, 258 AM

[56] References Cited

U.S. PATENT DOCUMENTS 4,292,092  9/1981  Hanak .................... 148/1.5
4,481,378  11/1984  Lesk ...................... 136/244

FOREIGN PATENT DOCUMENTS 56-69871  6/1981  Japan .................................. 136/244
57-122580  7/1982  Japan .................................. 136/244

Primary Examiner—Aaron Weisstuch
Attorney, Agent, or Firm—Birch, Stewart, Kolasch & Birch

[57] ABSTRACT

A sun light electricity generator comprising an amorphous sun light battery, which comprises: a conductive substrate which also constitutes an output electrode; amorphous semiconductor layers provided on the substrate, said layers constituting a p-i-n junction structure for a sun battery element and for a protection diode; an electrode for the sun battery element and an electrode for the protection diode, both provided on the light incident amorphous layer but separated from each other; and an electrode for connection to another generator provided on a region of the substrate where the amorphous layers are not provided.

5 Claims, 7 Drawing Figures

SUN LIGHT ELECTRICITY GENERATOR

FIELD OF THE INVENTION

The present invention relates to a sun light electricity generator, and more particularly to one using amorphous silicon or the like which is effective in practical use as a power device.

BACKGROUND OF THE INVENTION

Generally, a sun light battery using an amorphous silicon or the like has a low reverse blocking voltage, and in the case where some elements come into shade in a module in which plural elements are implemented, the electro-motive forces generated by the unshaded elements are applied to the shaded elements in a reverse polarity, and these elements are likely to be destroyed. In order to prevent this destruction, a monocrystalline silicon diode is soldered onto the sun light battery substrate as a protection diode.

An example of a conventional device of such construction is shown in FIG. 1. The reference numeral 1 designates a conductive substrate. The numeral 2 designates a first conductivity type, for example, n type amorphous silicon semiconductor. The numeral 3 designates an intrinsic amorphous silicon semiconductor. The reference numeral 4 designates a second conductivity type, for example, p type amorphous silicon semiconductor. The numeral 5 designates a transparent conductive film. The numeral 6 designates a metal current collecting electrode. The numeral 7 designates a metal electrode for connection purposes provided at an outer region of the substrate 1. The numeral 8 designates a second conductivity type crystalline silicon semiconductor. The numeral 9 designates a first conductivity type crystalline silicon semiconductor. The numeral 10 designates a connecting wire for the sun battery element. The numeral 11 designates a connecting wire for the protection diode.

This sun light battery device is manufactured as follows:

Amorphous silicon semiconductor layers 2, 3, 4 are deposited on the conductive substrate 1, the transparent conductive film 5 is vapor-plated thereon, and the metal current collecting electrode 6 and the metal electrtode 7 are vapor-plated on the film 5 and the substrate 1, respectively, to produce a sun battery element. Thereafter, a diode comprising the crystalline silicon semiconductor 8 having the same coductivity type as that of the amorphous silicon semiconductor 4 and the crystalline silicon semiconductor 9 having the same conductivity type as that of the amorphours silicon semiconductor 2 is soldered onto the substrate electrode 7 on the substrate 1. This diode is connected to the sun light battery element by the sun battery element connecting wire 10 and the protection diode connecting wire 11. Thus, the device has a connection as shown in FIG. 2, whereby current-voltage characteristics shown in FIG. 3 are obtained.

In the conventional sun light battery of such a construction, it is necessary to solder a small silicon diode onto a substrate, and in this soldering there is likely to occur a short-circuiting because of the small size of the diode element. Accordingly, it takes a long time for the construction of this device, and the reliability thereof is low.

Another prior art sun light battery is disclosed in Japanese Laid-Open Patent Specification No. 57-122580. In this device, a sun battery element is connected with a diode provided with an adjacent sun battery element in reverse parallel relation, and a series connection of these parallel circuits is realized.

OBJECTS AND SUMMARY OF THE INVENTION

The present invention is directed toward solving the problems pointed out with respect to the conventional device, and has for its object to provide a sun light electricity generator without the necessity of soldering a small element, thereby enabling a reduced construction time and enhancing the reliability to a great extent.

Other objects and advantages of the present invention will become apparent from the detailed descriptoin given hereinafter. It should be understood, however, that the detailed description and specific embodiment are given by way of illustration only, since various changes and modifications within the spirit and scope of the invention will become apparent to those skilled in the art from this detailed description.

According to the present invention, there is provided a sun light generator comprising an amorphous sun light battery, which includes a conductive substrate which also constitutes an output electrode; amorphous semiconductor layers provided on the substrate, said layers constituting a single p-i-n junction structure for a sun battery element and a protection diode; an electrode for the sun battery element and an electrode for the protection diode, both provided on the amorphous layers but separated from each other by a predetermined distance; and a connection electrode provided on a region of the substrate where the amorphous layers are not provided.

DETAILED DESCRIPTION OF THE PREFERRED EMBODIMENTS

Figure 1:
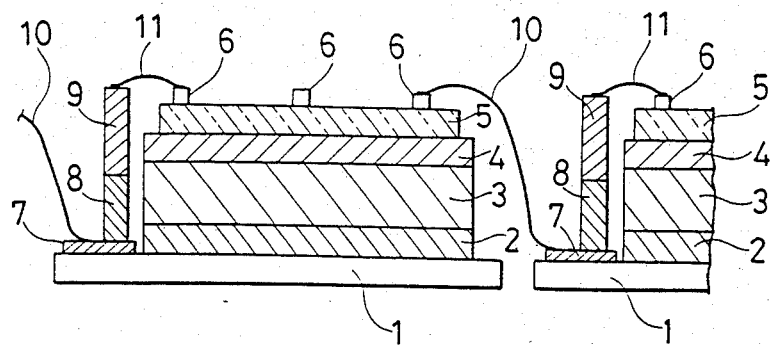
FIG. 1 is a schematic diagram of a conventional sun light battery module including a protection diode.
Figure 2:
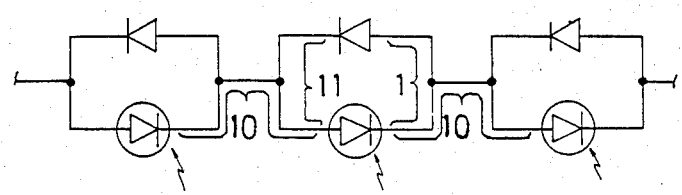
FIG. 2 is a circuit diagram of the device of FIG. 1.
Figure 3:
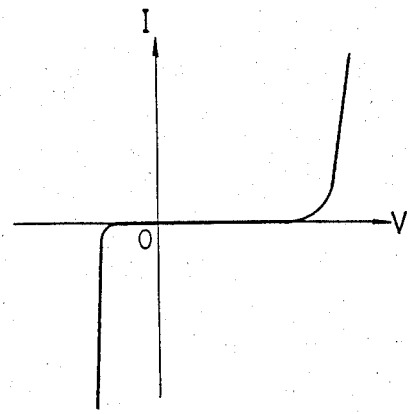
FIG. 3 is a diagram showing current-voltage characteristics of the device of FIG. 1.
Figure 4:
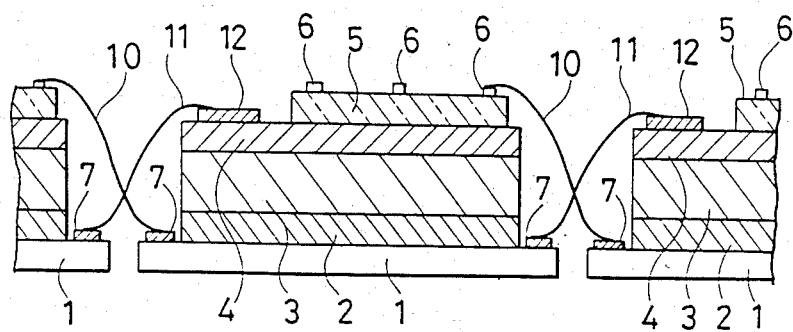
FIG. 4 is a schematic diagram of a single-layer amorphous silicon sun light generator of one embodiment of the present invention.

In order to explain one embodiment of the present invention, reference will be particularly made to FIG. 4, wherein the same reference numerals are used to designate the same or corresponding parts or elements as those in FIG. 1:

The reference numeral 12 designates a metal electrode for the protection diode which is also constituted by the three amorphous silicon semiconductor layers 2, 3, 4, and this metal electrode 12 is vapor-plated on the amorphous silicon semiconductor layers 2, 3, 4 at the same time as the metal electrodes 6, 7 are being vapor-plated on the transparent conductive film 5 and on the substrate, respectively. The reference numeral 10 designates a connecting wire for connecting the current collecting electrode 6 of the sun battery element with the metal electrode 7 of the adjacent sun light battery. The reference numeral 11 designates a connecting wire for connecting the metal electrode for the protection diode 12 with the metal electrode 7 of the other adjacent sun light battery.

The amorphous silicon semiconductor has a relatively high resistance, and only the region below the surface electrode becomes an effective active region. Accordingly, in FIG. 4, the amorphous silicon layers below the transparent conductive film (a sun battery electrode) 5 and the amorphous silicon layers below the metal electrode for the protection diode 12 can be considered to be perfectly electrically separated from each other.

Figure 5:
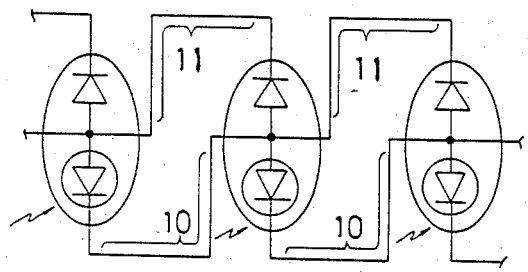
FIG. 5 is a circuit diagram thereof.

The operation of this device is the same as that of the device where two diodes are mounted on the same substrate separated from each other, and when a connection shown in FIG. 4 is effected the circuit diagram becomes as shown in FIG. 5.

Figure 6:
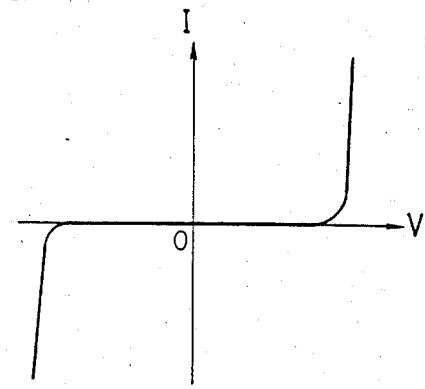
FIG. 6 is a diagram showing current-voltage characteristics of the device of FIG. 4.

The current-voltage characteristics thereof are shown in FIG. 6, and it is easily understood that the protection diode effectively functions.

In such an embodiment the protection diode is produced at the same time as the sun light battery element. So, it becomes unnecessary to solder a small crystalline silicon diode onto a substrate, thereby making it easy to assemble, and enhancing the reliability.

In the above-illustrated embodiment a single-layer amorphous silicon sun light battery is used, but it is, of course, possible to apply the present invention to a multi-layer amorphous silicon sun light battery, and a protection diode can be produced by the same process.

Figure 7:
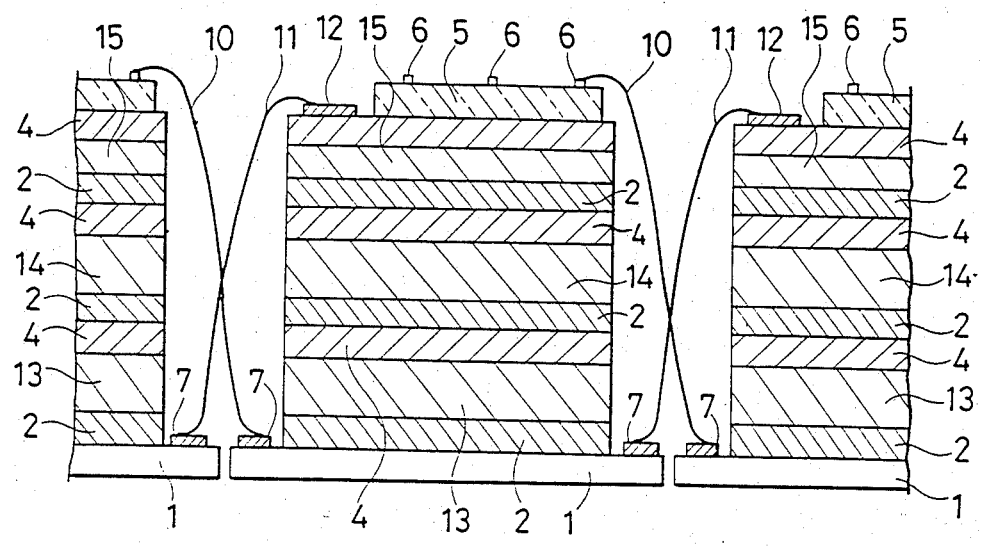
FIG. 7 is a schematic diagram showing another embodiment of the present invention.

FIG. 7 shows a second embodiment of the present invention, wherein the sun light battery has a three-layer amorphous silicon structure.

The reference numeral 1 designates a conductive substrate. The reference numeral 2 designates a first conductivity type, for example, n type silicon semiconductor. The numeral 13 designates an intrinsic tetrahedrally bonded amporphous alloy semiconductor (I) (for example, a-SiGe:H). The numeral 14 designates an intrinsic tetrahedrally bonded amorphous alloy semiconductor (II) (for example, a-Si :H). The reference numeral 15 designates an intrinsic tetrahedrally bonded amorphous alloy semiconductor (III) (for example, a-SiN:H). The numeral 4 designates a second conductivity type, for example, p type amorphous silicon semiconductor. The numeral 5 designates a transparent conductive film, the numeral 6 designates a metal current collecting electrode. The numeral 7 designates an electrode for connection provided on the substrate 1. The numeral 12 designates a metal electrode a protection diode. The numeral 10 designates a connecting wire for the sun battery element. The numeral 11 designates a connecting wire for the protection diode.

The operation of this device is the same as that of the single-layer amorphous silicon sun light battery.

Furthermore, the transparent conductive film 5, and the metal electrodes 6, 7, 12 are produced by vapor-plating, but these can be produced by sputtering, screen printing, or the like with the same effect.

What is claimed is:

1. A sun light electricity generator including an amorphous sun light battery, comprising:
    a conductive substrate, said conductive substrate being an output electrode;
    amorphous semiconductor layers provided on said substrate, said layers including at least a single p-i-n junction structure for the formation of a sun light battery element and a protection diode;
    a collection electrode affixed on said sun light battery element and a metal electrode provided for said protection diode, said metal electrode and said collection electrode being affixed to the same light incident surface of said amorphous semiconductor layers but separated from each other by a predetermined distance; and
    a connection electrode provided on a region of said conductive substrate where said amorphous layers are not provided;
    said collection electrode, said metal electrode, and said connection electrode being simultaneously affixed to said sun light battery element, said protection diode, and said conductive substrate, respectively, thereby reducing construction time and enhancing reliability.
    A sun light generator as set forth in claim 1, wherein a plurality of amorphous sun light batteries are provided, said collection electrode for said sun light battery element being connected to said connection electrode of an adjacent amorphous sun light battery element and said metal electrode provided for said protection diode being connected to said connection electrode of another adjacent amorphous sun light battery.

2. A sun light generator as set forth in claim 1, wherein a plurality of amorphous sun light batteries are provided, said collection electrode for said sun light battery element being connected to said connection electrode of an adjacent amorphous sun light battery element and said metal electrode provided for said protection diode being connected to said connection electrode of another adjecent amorphoussun light battery.

3. A sun light generator as set forth in claim 1, wherein said amorphous sun light battery has a single-junction structure.

4. A sun light generator as set forth in claim 1, wherein said amorphous sun light battery has a multi-junction structure.

5. A sun light generator as set forth in claim 1, further including a transparent conductive film formed between the surface of said amorphous sun light battery element and said collection electrode affixed thereon wherein the portion of the amorphous semiconductor layers below said transparent conductive film is electrically separated from the portion of the amorphous semiconductor layers below said metal electrode of said protection diode.

* * * * *